United States Patent [19]

Matsumura

[11] Patent Number: 5,148,499
[45] Date of Patent: Sep. 15, 1992

[54] IMAGE RECONSTRUCTION PROCESS AND APPARATUS USING INTERPOLATED IMAGE RECONSTRUCTED DATA

[75] Inventor: Shigeru Matsumura, Tokyo, Japan

[73] Assignee: Yokogawa Medical Systems, Limited, Tokyo, Japan

[21] Appl. No.: 789,459

[22] Filed: Nov. 7, 1991

Related U.S. Application Data

[63] Continuation of Ser. No. 635,491, filed as PCT/JP89/00655, Jun. 29, 1989, abandoned.

[30] Foreign Application Priority Data

Jun. 30, 1988 [JP] Japan ............................... 63-163097

[51] Int. Cl.$^5$ ............................................. G06K 9/40
[52] U.S. Cl. .................................... 382/54; 382/6; 382/17; 364/413.18; 364/413.19; 378/901
[58] Field of Search ................ 382/6, 17, 47, 54; 358/111, 138, 428; 364/413.16, 413.18, 413.19; 378/901

[56] References Cited

U.S. PATENT DOCUMENTS

| | | | |
|---|---|---|---|
| 4,135,247 | 1/1979 | Gordon et al. | 364/413.18 |
| 4,570,224 | 2/1986 | Shimoni et al. | 378/901 |
| 4,682,291 | 7/1987 | Reuveni | 364/413.18 |
| 4,740,896 | 4/1988 | Horiba et al. | 382/54 |
| 4,841,553 | 6/1989 | Nagai | 364/413.18 |
| 4,979,111 | 12/1990 | Nishimura | 364/413.18 |

*Primary Examiner*—Jose Couso
*Attorney, Agent, or Firm*—Moonray Kojima

[57] ABSTRACT

An image reconstruction process and apparatus, for obtaining a two-dimensional enlarged image of high quality, without causing unnecessary increase in the quantity of calculations; wherein data in a frequency space is filtered with a filter having frequency characteristics of an inverse function of an amplitude-transmitting function to be performed thereafter, then image reconstructing the data obtained through the filtering process to provide image reconstruction data; interpolating the image reconstruction data at interior division points of 1:3 and 3:1 of adjacent data; and forming image display by using the interpolated image reconstruction data as the image display data.

6 Claims, 3 Drawing Sheets

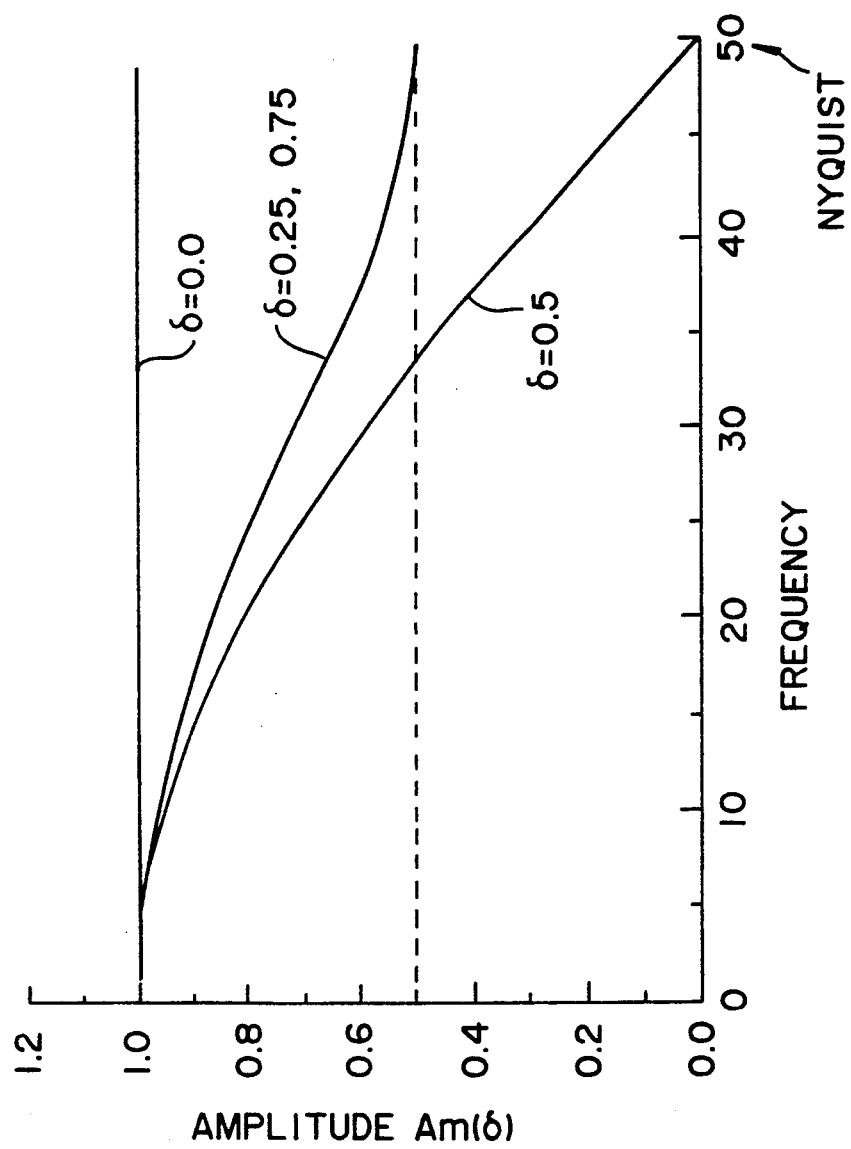

IMAGE RECONSTRUCTION PROCESS AND APPARATUS USING INTERPOLATED IMAGE RECONSTRUCTED DATA

This is a continuation of application Ser. No. 635,491 filed as PCT/JP89/00655, Jun. 29, 1989, now abandoned.

TECHNICAL FIELD

The present invention relates to a process and an apparatus for obtaining data, so as to improve display resolution in X-ray CT or MRI, the process comprising reconstructing image of the data items in a frequency space, interpolating data items among the image data items, and increasing the number of the data items by two fold in the interpolating direction; more specifically, the present invention relates to the process and apparatus for reconstructing image to be intended to improve the image quality of the image through the process of the two-fold enlargement.

BACKGROUND ART

There generally develops in an image the phenomenon called stairup, an artifact in the form of stair, which is disadvantageous for the purpose of diagnostics, if the number of pixels is not enough in a diagnostic imaging system such as X-ray CT or MRI for displaying images. Hence, stairup has recently been avoided, by employing a display system with a larger number of pixels and rendering the size of one pixel smaller, so as to improve image quality. When the resolution of a display device is thus improved to improve an image itself proportionally, however, the ratio S/N of the data may be lowered so that the noise in the image may be increased to deteriorate the image. In case of X-ray CT, the decrease in the ratio S/N can be compensated by the increase in exposure dose, which causes detrimental effects to human body. In case of MRI, its decrease can be compensated by prolonged data collecting time, leading to the extension of imaging time to give more stress to a subjective. There are additional problems, involving the requirement of image reconstruction time to transform collected data into image data, and the increase in the cost of a device in relation thereto. In other words, in terms of processing an identical quantity of information, simple improvement of the display resolution without enhancing the resolution of image itself involves a vast amount of calculation process, which is not economical. Therefore, without increasing the number of data items at image reconstruction, it is desirable to use interpolation process with relatively less calculation process, so as to enlarge the image after reconstruction to obtain a high-quality display image.

FIGS. 4A and 4B are diagrams representing the interpolation process in conventional embodiments, where FIG. 4A is a diagram showing the data matrices before interpolation and FIG. 4B is a diagram showing the data matrices after interpolation. In FIGS. 4A and 4B, the black spots are reconstructed image data items, while the white spots are interpolated data items generated from the image data items. In case that the image restructured in the data matrix of 256×256 is displayed on a display device having the pixel number of 512×512, for example, two-fold enlargement is carried out in such manner that interpolated data items by linear interpolation and the like are inserted among the reconstructed data items of FIG. 4A as is shown in FIG. 4B. However, the frequency characteristic feature of the data items produced by interpolation is deteriorated generally, which causes the problems of the blurring in image and the change in its texture. In order to reduce the deterioration, there may be suggested the use of a higher-degree interpolation function. In that case, the time required for calculating the interpolation gets longer. When the point $f(X)$ ($X_0 < X < X_1$) is to be determined between $f(X_0) = f_0$ and $f(X_1) = f_1$, according to one-dimensional Lagrange's interpolation of 2 k degree from the $(2k+1)$ data items, the following is calculated;

$$f(X) = \sum_{J=-k}^{J=k} L_J(X) \cdot f_J$$

($L_k(X)$: weighing function of 2 k degree; $f_{-k}, \ldots, f_k$: data sequence) Hence, the number of the calculation process to carrying out the interpolation for a two-dimensional image consequently increases in proportion with the degree number of the interpolation formula (1).

In obtaining image data for a display device of a larger number of pixels by increasing the number of image data items after reconstruction by means of interpolation without increasing the number of data items at reconstruction as has been described above, there may be caused the image deterioration by conventional low-degree interpolation process. When employing a higher-degree interpolation in order to compensate such deterioration, there may develop problems, such as the increase in the number of calculation process involving the prolongation of the processing time, and the elevation of the cost of a device therefor which is imposed by the complexity of a circuit construction.

DISCLOSURE OF THE INVENTION

The present invention is intended to provide the process and apparatus of image reconstruction so as to generate a high-quality two-fold enlarged image.

The present invention comprises filtering process of the data items on a frequency space, with a filter with frequency characteristics as an inverse function corresponding to an amplitude-transmitting function of the interpolation thereafter processed, image reconstructing the data items through the filtering process, determining data items interpolated at the interior divisional points of 1:3 and 3:1 of an adjacent data set among the reconstructed image data, individually, by means of interpolation, and utilizing only the interpolated data items as image data items for display.

By the preliminary filtering process of the data items on a frequency space with the inverse function of an amplitude-transmitting function, in accordance with the present invention, the frequency deterioration by the interpolation after image reconstruction is countervailed, which excludes the chance of image deterioration.

BRIEF DESCRIPTION OF DRAWINGS

FIG. 1 is a graph representing amplitude-transmitting function in the interpolation direction, by linear interpolation of one embodiment of the present invention.

BEST MODE OF CARRYING OUT THE INVENTION

Figure 2A:
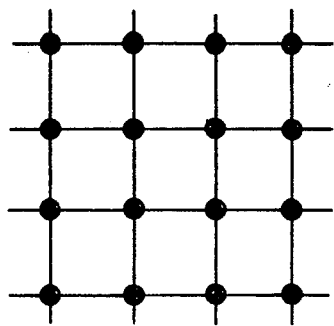
FIGS. 2A and 2B are diagrams showing the interpolation process of one embodiment of the present invention.

The theoretical background of the present invention is firstly explained. The formula for linearly interpolating an point $f(X_0+\delta)$ between $f(X_0)=f_0$ and $f(X_1)=f(X_1)$ among the data sequence $f_0, f_1, ---, f_n$, is represented as follows;

$$f(X0+\delta)=(1-\delta)f0+\delta f_1 \tag{2}$$

$0 \leq \delta < 1$: distance from $X_0$

As the formula (2) is in the form of convolution (superimposed integration) of the original data and their weights, the amplitude-transmitting function $Tm(\delta)$ in the interpolation direction is represented in the following;

$$Tm(\delta) = \sum_{J=-1}^{1} W_J \cdot \exp(-2\pi i m j/N) \tag{3}$$

$$W_0 = 1 - \delta, W_1 = \delta, W_{-1} = 0$$

$$i = (-1)^{\frac{1}{2}}$$

$m/N$: frequency represented in a discrete system
$m=N/2$: Nyquist frequency The real part and imaginary part of $Tm(\delta)$ are as follows, respectively;

$$Rm(\delta)=1-2\delta \sin^2(\pi m/N)$$

$$Im(\delta)=-2\delta \sin(\pi m/N) \cos(\pi m/N) \tag{4}$$

Thus, the amplitude-transmitting function $Am(\delta)$ is shown in the following;

$$Am(\delta) = [Rm^2 + Im^2]^{\frac{1}{2}} \tag{5}$$
$$= \{1 - 4\delta(1 - \delta)\sin^2(\pi m/N)\}^{\frac{1}{2}}$$

If the data items in a frequency space is preliminarily processed with filtering with an inverse function of an amplitude-transmitting function when the amplitude-transmitting function through interpolation is determined as is shown above, the deterioration of frequency by the interpolation after image reconstruction can be compensated.

One embodiment of the present invention is now explained. FIG. 1 is a graph representing amplitude-transmitting function in the interpolation direction, by linear interpolation. In the graph, the abscissa shows frequency $m/N$ and the ordinate shows amplitude $Am(\delta)$.

In the conventional process, the point of $\delta=0.5$ is determined by interpolation, and the original data, namely on the point at $\delta=0.0$ is used together with the interpolated data, namely on the point at $\delta=0.5$ to generate an two-fold enlarged image. As is shown in the graph, the data without deteriorated frequency (the data on the point at $\delta=0.0$) is thus arranged with the data with the most deteriorated frequency (the data on the point at $\delta=0.5$), alternatively, which deteriorates the image. Since the point with the most deteriorated frequency has a transmitting function of 0 at Nyquist frequency, there may arise a disadvantage of an occurrence of pole (divergent point) when the corresponding inverse function is reduced.

On the contrary, in the embodiment of the present invention, the data items corresponding to the points at $\delta=0.25$ and $\delta=0.75$ are determined by interpolation, which interpolated points are solely employed to generate a two-fold enlarged image. As the formula (5) can satisfy the equation $Am(\delta)=Am(1-\sigma)$, the points of $\delta=0.25$ and $\delta=0.75$ consequently have the same amplitude-transmitting function as is shown in the graph of FIG. 1, so that the frequency deterioration after enlargement gets homogeneous. As there is no point with a transmitting function of 0, no pole (divergent point) develops when an inverse function is reduced. In other words, the selection of the points of $\delta=0.25$ and $\delta=0.75$ as interpolating points, can render the filtering process in advance of the data in a frequency space, which countervails the frequency deterioration at interpolation.

Figure 2B:
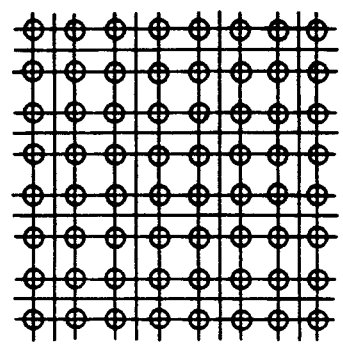
Figure 4A:
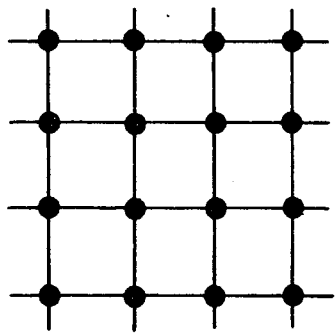
FIGS. 4A and 4B are diagrams representing the interpolation process of a conventional example.
Figure 4B:
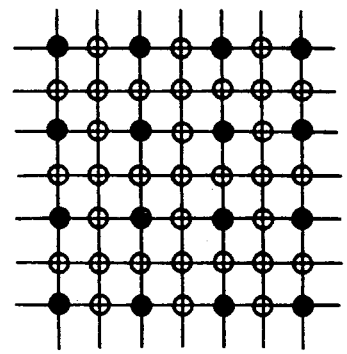

FIGS. 2A and 2B are diagrams showing the interpolation process of one embodiment of the present invention; FIG. 2A is a diagram of data matrices before interpolation, while FIG. 2B is a diagram of the data matrices after interpolation. In these figures, the original data items are shown in black points as are in FIGS. 4A and 4B; the interpolated data items, in white points. As in FIG. 2B, in the present embodiment, the interpolated data items at the interior division points of 1:3 and 3:1 of an adjacent data, individually, are determined by means of linear interpolation, which interpolated data are solely employed as new image data to generate a two-fold enlarged image data. As is shown in the figure, the interval of the interpolated points gets half of the original data interval.

Figure 3:
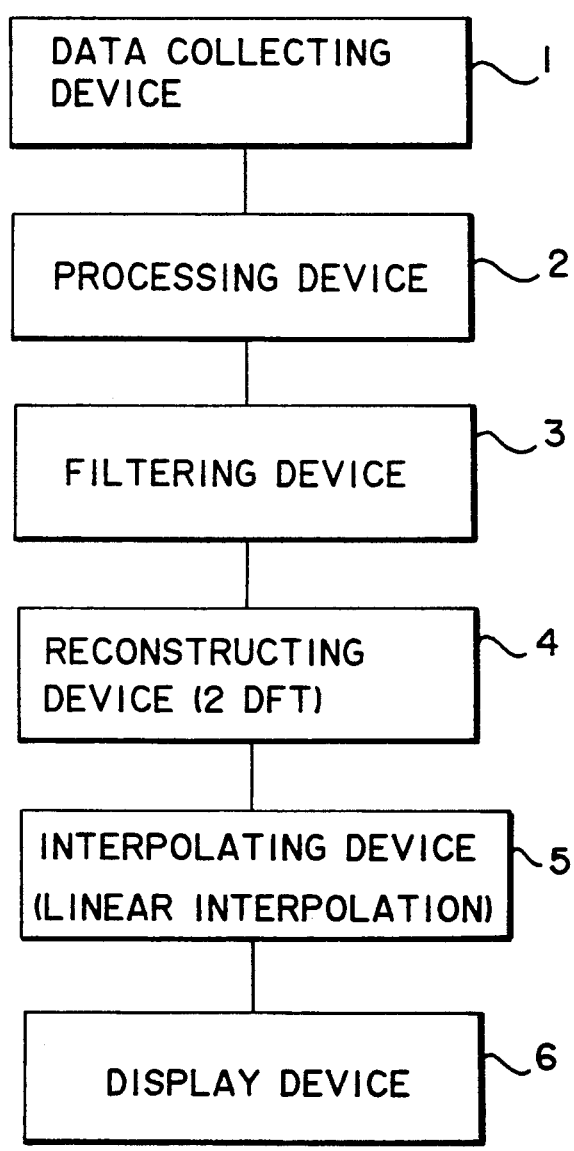
FIG. 3 is a block diagram representing an image-reconstruction device with a two-fold enlargement potency of one embodiment of the present invention.

FIG. 3 is a block diagram representing an image-reconstruction device with a two-fold enlargement function of one embodiment of the present invention. The construction of FIG. 3 is different from conventional ones, in that the filter characteristics of a filtering device 3 have the characteristics of an inverse function of the equation (5), and that an interpolating device 5 interpolates the data items on the points of $\delta=0.25$ and $\delta=0.75$, separately, and the thus interpolated data alone are used to output the data for image display.

The operation of the present embodiment will now be explained. Data, collected by means of a data collecting device 1 to collect data from MRI, X-ray CT and the like, is transformed into the data on a two-dimensional Fourier plane by means of a processing device 2. The data on the two-dimensional Fourier plane is then processed with filtering by means of a filtering device 3. The filtering process is performed both in x-axis and y-axis, independently, because the data is prepared on a two-dimensional Fourier plane. Next, image reconstruction calculation according to 2DFT (two-dimensional Fourier transformation) is carried out by means of an image reconstruction device 4, to transform the data items into image data items. The image data items are high-frequency intensified data items, because the filter characteristics have the inverse function of the formula (5). Finally, the interior divisional points of an adjacent data set of 1:3 and 3:1, namely, the data items of $\delta=0.25$ and $\delta=0.75$ are separately determined by interpolation. Only the data items corresponding to the interpolated points, are used to generate a two-fold enlarged image, which is displayed on a display device 6. The two-fold enlarged image herein obtained has less frequency deterioration due to the fact that the deteriorated part of frequency due to interpolation and the high-frequency intensified part due to filtering are countervailed with each other.

In the apparatus of the present embodiment as is described, only the filtering process with the characteristics of the inverse function of the formula (5) enables to generate a high-quality two-fold enlarged image by using the interpolating means utilizing linear interpolation and with simple circuit structure. Since all data items are calculated through interpolation in the present embodiment, it may seem to take a longer time to process data according to the present embodiment, compared with the conventional process wherein only half of image data is calculated through interpolation in each direction. However, the conventional process requires the separate processes for interpolated data and original data. Alternatively, the present embodiment does not require such process, which renders the construction of an interpolating circuit simpler due to such no requirement.

The present invention is not limited to the above embodiment, and various modifications are possible within the scope of the invention. The present invention can be applied not only to an apparatus to perform image reconstruction according to the Fourier process as explained in the embodiment but also to an apparatus for image reconstruction following the filtered back projection process of X-ray CT. But in such case where the data is one-dimensional Fourier data on a polar coordinate system, the direction for interpolation is different from the direction of filter, so that in relation to each view angle, there must be prepared a filter including an inverse function where the deteriorations in x-axis and y-axis are synthesized together to be employed for filtering, in order to accurately perform filtering. However, the preparation of one including an inverse function of rotation symmetry as an approximation, instead, may exclude the increase in the number of filter and in the involved calculation process. In such case, a filter is made to have the filter characteristics of a filter originally made for the filtered back projection process multiplied with the inverse function of rotation symmetry. The interpolation process is not limited to linear interpolation; a high-dimensional (two-dimensional or higher) interpolation means may be used, as long as the amplitude-transmitting function can satisfy the equation $Am(\delta)=Am(1-\delta)$, and the inverse function thereof can be determined. There may be used not only two-dimensional image but also a high-dimensional image such as three-dimensional image.

What is claimed is:

1. An image reconstruction method for an X-ray CT or MRI system comprising an image reconstructing apparatus for processing image data in frequency space, data collector means for collecting image data of a subject being examined, and processing means for transforming the image data of the subject to image data on a 2-dimensional Fourier plane, wherein the method comprises the steps of filtering said image on said 2-dimensional Fourier plane obtained from said processing means using a filter means having a frequency characteristic which is an inverse of the following amplitude transmitting function $Am(\delta)$:

$$Am(\delta) = (Rm^2 + Im^2)^{\frac{1}{2}}$$
$$= [1 - 4\delta(1 - \delta) \sin^2(\pi m/N)]^{\frac{1}{2}}$$

wherein Rm is the real part of the amplitude transmitting function, Im is the imaginary part of the amplitude transmitting function, m/N is the frequency represented in a discrete system, and m=N/2 is the Nyquist frequency;

image reconstructing the filtered data obtained from said filtering step, and generating high frequency intensified image reconstructed items of data;

interpolating the high frequency intensified image reconstructed items of data at points located ⅓ and ⅔ between adjacent items of data and outputting the obtained interpolated items of data; and forming a two fold enlarged image using only the interpolated items of data so that said two fold enlarged image is substantially free of frequency distortion.

2. The method of claim 1, wherein the interpolation of image reconstructed data is linear interpolation.

3. The method of claim 1, wherein the interpolation of image reconstructed data is multi-dimensional interpolation.

4. In an X-ray CT or MRI system comprising an image reconstruction apparatus for processing image data in a frequency space, said image reconstruction apparatus comprising data collector means for collecting image data of a subject being examined, and processing means connected to said data collector means for transforming the image data of the subject collected by said data collector means to image data on a 2-dimensional Fourier plane, the improvement comprising filtering means connected to said processing means for independently filtering on an X-axis and a Y-axis the processed image data on a 2-dimensional Fourier plane obtained from said processing means using a filter having a frequency characteristic which is an inverse of the following amplitude transmitting function $Am(\delta)$:

$$Am(\delta) = (Rm^2 + Im^2)^{\frac{1}{2}}$$
$$= [1 - 4\delta(1 - \delta) \sin^2(\pi m/N)]^{\frac{1}{2}}$$

wherein Rm is the real part of the amplitude function, Im is the imaginary part of the amplitude transmitting function, m/N is the frequency represented in a discrete system, and m=N/2 is the Nyquist frequency;

image reconstructing means connected to said filtering means for image reconstructing the filtered data obtained from said filtering means and for generating high frequency intensified image reconstructed items of data;

interpolating means connected to said image reconstructing means for interpolating the high frequency intensified image reconstructed items of data at points located at ⅓ and ⅔ between adjacent items of data, and for outputting the obtained interpolated items of data; and image forming means connected to said interpolating means for forming a two-fold enlarged image using only the interpolated image reconstructed items of data obtained from said interpolating means so that the said two fold enlarged image is substantially free of frequeny distortion.

5. The apparatus of claim 4, wherein the interpolating means comprises means for linear interpolating the image reconstructed data.

6. The apparatus of claim 4, wherein the interpolating means comprises means for multi-dimensional interpolating the image reconstructed data.

* * * * *